United States Patent
Hsu et al.

(10) Patent No.: US 7,443,265 B2
(45) Date of Patent: Oct. 28, 2008

(54) METHOD FOR IMPEDANCE MATCHING BETWEEN DIFFERENTIAL VIAS AND TRANSMISSION LINES

(75) Inventors: Shou-Kuo Hsu, Tu Cheng (TW); Cheng-Hong Liu, Tu Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 204 days.

(21) Appl. No.: 11/308,690

(22) Filed: Apr. 22, 2006

(65) Prior Publication Data
US 2007/0018751 A1    Jan. 25, 2007

(30) Foreign Application Priority Data
Jul. 21, 2005    (CN) .......................... 2005 1 0036126

(51) Int. Cl.
*H03H 7/38*    (2006.01)

(52) U.S. Cl. .......................................... 333/33; 333/260
(58) Field of Classification Search .................. 333/33, 333/246, 260
See application file for complete search history.

(56) References Cited

U.S. PATENT DOCUMENTS

| 6,724,890 B1 | 4/2004 | Bareis |
| 2003/0043001 A1* | 3/2003 | Aruga .......................... 333/246 |

* cited by examiner

*Primary Examiner*—Stephen E Jones
(74) *Attorney, Agent, or Firm*—Wei Te Chung

(57) ABSTRACT

A method for impedance matching between differential vias and associated transmission lines is provided. The method includes: deducing a relationship of a space between the differential vias, and a radius of the differential vias while a characteristic impedance of the differential vias matches a characteristic impedance of the differential transmission lines; and determining the space and the radius according to the relationship between the space and the radius.

6 Claims, 1 Drawing Sheet

METHOD FOR IMPEDANCE MATCHING BETWEEN DIFFERENTIAL VIAS AND TRANSMISSION LINES

FIELD OF THE INVENTION

The present invention relates to a method for impedance matching, and particularly to a method for impedance matching between differential vias and associated transmission lines.

DESCRIPTION OF RELATED ART

Signal integrity is an important factor to be taken into account when a printed circuit board (PCB) is designed. A well-designed PCB has an elevated on-off switching speed of integrated circuits, and a high density, compact layout of components. Parameters of the PCB substrate, a layout of the components on the PCB, and a layout of high-speed signal transmission lines all have an impact on signal integrity. In turn, proper signal integrity helps the PCB and an associated computer system to achieve stable performance. Impedance matching is considered an important part of signal integrity.

For differential vias and associated transmission lines, characteristic impedances of the differential vias need to equal or approach characteristic impedances of the differential transmission lines. A pair of differential transmission lines laid on the PCB includes two transmission lines having a same length, and transmitting signals in mutually opposite directions. Differential transmission lines laid on different layers of the PCB can be connected by differential vias. Conventionally, the characteristic impedance of the differential vias is 12% less than the characteristic impedance of the differential transmission lines connected to the vias. Thus, the characteristic impedance of the differential vias does not match the characteristic impedance of the differential transmission lines. Signals arriving at the differential vias are apt to be partially reflected so as to cause a waveform of the signals to distort, overshoot, or undershoot. Thus, the differential vias without appropriate design may reduce the quality of the signals passed by the differential vias and the differential transmission lines.

What is needed, therefore, is a method for impedance matching between differential vias and associated transmission lines.

SUMMARY OF INVENTION

A method for impedance matching between differential vias and associated transmission lines is provided. In a preferred embodiment, the method includes the steps of: deducing an equation that uses a relationship of a characteristic impedance of the differential vias, a space between the differential vias, and a radius of the differential vias; calculating a characteristic impedance of the differential transmission lines as a desired impedance of the characteristic impedance of the differential vias; acquiring a relationship between the space and the radius according to the desired impedance and the equation; and determining the space and the radius according to the relationship between the space and the radius. It is of advantage that the method can match the characteristic impedance of the differential vias with the characteristic impedance of differential transmission lines, and improve the quality of the signals passed by the differential vias and the differential transmission lines.

Other advantages and novel features will become more apparent from the following detailed description when taken in conjunction with the accompanying drawings, in which:

DETAILED DESCRIPTION

Figure 1:
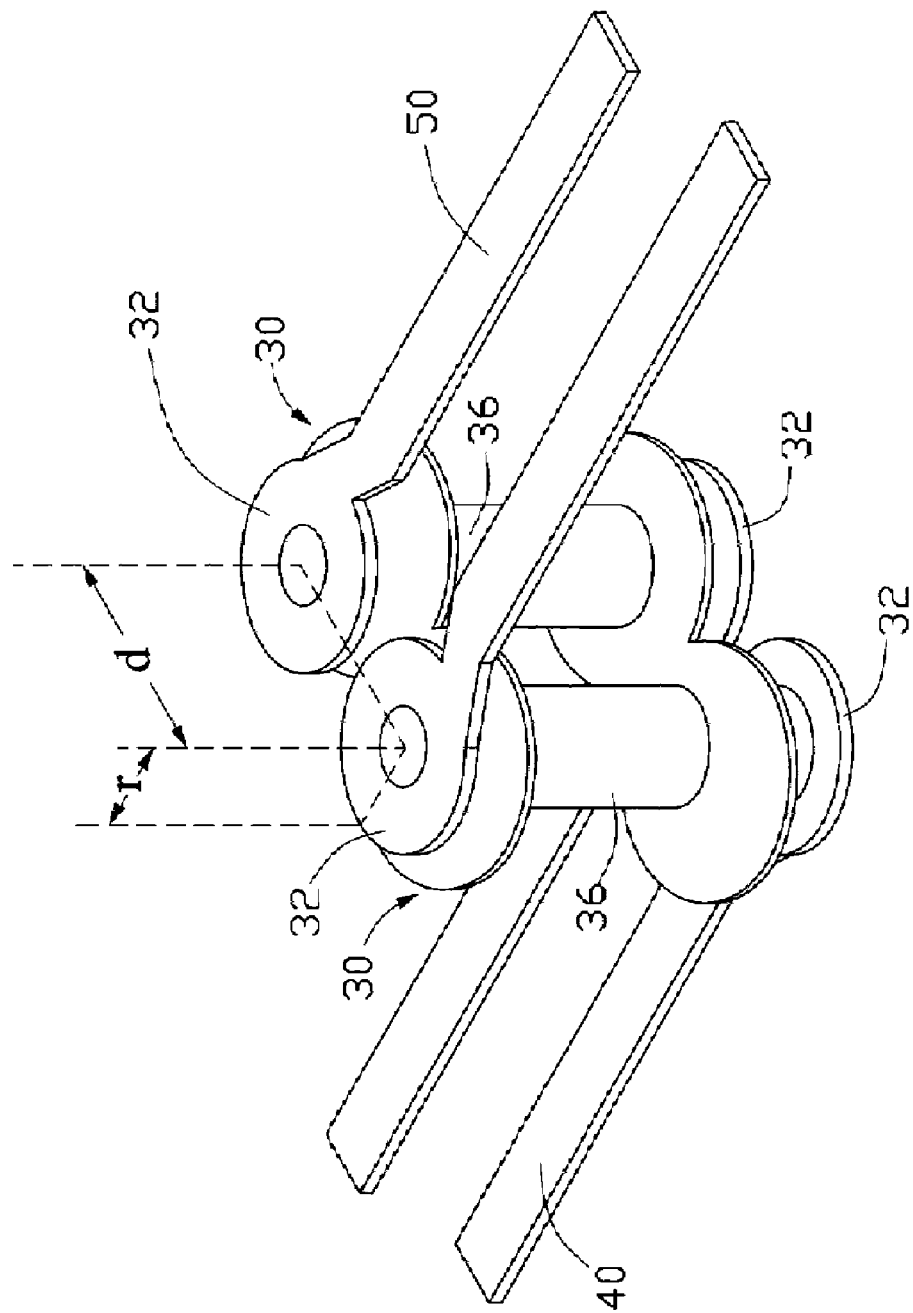
FIG. 1 is a schematic diagram of differential vias and associated transmission lines, in accordance with a preferred embodiment of the present invention.

FIG. 1 shows a pair of differential vias and two pairs of associated differential transmission lines, in accordance with a preferred embodiment of the present invention. Each of the differential vias 30 includes via pads 32, and via barrels 36. The differential transmission lines 40 and the differential transmission lines 50 are laid on different layers, and are connected by the differential vias 30. The differential transmission lines 40 and the differential transmission lines 50 respectively have a characteristic impedance Y. The via barrels 36 are used for transferring signals to different layers. A radius of the via pads 32 is treated as a radius of the differential vias 30. A space between the centers of the via pads 32 is treated as a space between the differential vias 30.

A mutual inductance is found using the following equation:

$$L = \frac{u}{\pi} \cosh^{-1}\left(\frac{d}{2r}\right)$$

A mutual capacity is found using the following equation:

$$C = \frac{\pi e}{\cosh^{-1}(d/2r)}$$

Wherein u is a magnetic conductivity, also known as magnetic permeability, of each of the differential vias 30, e is a dielectric constant, d is the space between the differential vias 30, and r is the radius of the differential vias 30. A characteristic impedeance Z of the differential vias 30 is deduced using the above equations:

$$Z = \sqrt{L/C} = \frac{\cosh^{-1}(d/2r)}{\pi}\sqrt{\frac{u}{e}}$$

The method for impedance matching between differential vias and associated transmission lines includes the following steps:

Step 1: formulating the equation that uses a relationship of the characteristic impedance Z of the differential vias 30, the space d between the differential vias 30, and the radius r of the differential vias 30;

Step 2: calculating the characteristic impedance Y of the differential transmission lines 40 as a desired impedance of the characteristic impedance Z of the differential vias 30;

Step 3: acquiring a relationship between the space d between the differential vias 30, and the radius r of the differential vias 30 according to the desired impedance and the equation;

Step 4: determining the space d and the radius r according to the relationship between the space d and the radius r. The determining step includes: selecting one parameter of the space and the radius adapting to a demand of a layout, and then calculating the other parameter of the space and the radius using the relationship between the space and the radius, and the selected parameter.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for impedance matching between differential vias and associated transmission lines, the method comprising the steps of:
    formulating an equation that uses a relationship of a characteristic impedance of the differential vias, a space between the differential vias, and a radius of the differential vias;
    calculating a characteristic impedance of the differential transmission lines as a desired impedance of the characteristic impedance of the differential vias;
    acquiring a relationship between the space and the radius according to the desired impedance and the equation; and
    determining the space and the radius according to the relationship between the space and the radius;
    wherein the equation is:

$$Z = \frac{\cosh^{-1}(d/2r)}{\pi}\sqrt{\frac{u}{e}}$$

Z is the characteristic impedance of the differential vias, u is a magnetic permeability of each of the differential vias, e is a dielectric constant, d is the distance between the differential vias, and r is the radius of the differential vias.

2. The method as claimed in claim 1, wherein the determining step comprises:
    selecting a fit space adapting to a demand of a layout; and
    calculating a desired radius using the relationship between the space and the radius, and the fit space.

3. The method as claimed in claim 1, wherein the determining step comprises:
    selecting a fit radius adapting to a demand of a layout; and
    calculating a desired radius using the relationship between the space and the radius, and the fit radius.

4. A method for impedance matching between differential vias and associated transmission lines, the method comprising the steps of:
    deducing an equation that uses a relationship of a space between the differential vias, and a radius of the differential vias while a characteristic impedance of the differential vias matches a characteristic impedance of the differential transmission lines; and
    determining the space and the radius according to the relationship between the space and the radius;
    wherein the equation is:

$$Z = \frac{\cosh^{-1}(d/2r)}{\pi}\sqrt{\frac{u}{e}}$$

Z is the characteristic impedance of the differential vias, u is a magnetic permeability of each of the differential vias, e is a dielectric constant, d is the distance between the differential vias, and r is the radius of the differehtial vias.

5. The method as claimed in claim 4, wherein the determining step comprises:
    selecting a fit space adapting to a demand of a layout; and
    calculating a desired radius using the relationship between the space and the radius, and the fit space.

6. The method as claimed in claim 4, wherein the determining step comprises:
    selecting a fit radius adapting to a demand of a layout; and
    calculating a desired radius using the relationship between the space and the radius, and the fit radius.

* * * * *